United States Patent [19]

Sekel

[11] 3,797,342

[45] Mar. 19, 1974

[54] PRINTED CIRCUIT BOARD WITH PLATED THROUGH HOLES

[75] Inventor: John Sekel, Cumberland, Ohio

[73] Assignee: The National Cash Register Company, Dayton, Ohio

[22] Filed: Mar. 22, 1973

[21] Appl. No.: 343,714

[52] U.S. Cl. ......................... 83/55, 83/133, 83/140, 83/620, 83/684, 83/691

[51] Int. Cl. ........................................... B26f 1/14

[58] Field of Search ......... 83/50, 55, 133, 140, 620, 83/622, 54, 684–691

[56] References Cited

UNITED STATES PATENTS 3,739,461 6/1973 Cupler ............................ 83/54 X

*Primary Examiner*—J. M. Meister

*Attorney, Agent, or Firm*—Wilbert Hawk, Jr.; Richard W. Lavin; J. T. Cavender

[57] ABSTRACT

A method and apparatus for punching holes in a printed circuit board which are to be subsequently plated. The method utilizes a punch comprising the fluted end of a standard high helix drill which is secured to a punch holder. The drill is supported by a stripper plate and a guide plate. The stripper plate is held against the printed circuit board by movement of the punch holder while the drill moves through the printed circuit board, punching and reaming a hole in the printed circuit board.

12 Claims, 4 Drawing Figures

PRINTED CIRCUIT BOARD WITH PLATED THROUGH HOLES

BACKGROUND OF THE INVENTION

This invention relates to a method and apparatus for punching a hole in a printed circuit board in the minimum amount of time and at the lowest cost. Printed circuit boards are primarily composed of an epoxy glass material which has required that each hole be first drilled and then reamed to provide an acceptable hole surface such that subsequent plating will provide the proper electrical connection. Prior attempts at punching holes in the printed circuit board has resulted in fractures of the surface around the holes which provided very poor electrical connection when subsequently plated. The requirement of drilling each hole separately in a printed circuit board constitutes the major cost of producing the board. It is therefore an object of this invention to provide a method and apparatus for fabricating holes in a punched circuit board which is low in cost but still capable of producing holes which will provide good electrical connection when plated.

SUMMARY OF THE INVENTION

In carrying out these objects, there is provided a punch apparatus which includes a removable die plate in which is located a plurality of apertures corresponding to the hole pattern required to be punched in the printed circuit board and on which the work piece is positioned, a stripper plate positioned on the printed circuit board having apertures aligned with the apertures in the die plate, means to provide variable pressure on the stripper plate and a movable punch die having punch members comprising the fluted end of a standard helix drill, the punch members moving through the stripper plate to punch and ream holes in the printed circuit board with the movement of the punch die providing an increase in pressure on the stripper plate.

DESCRIPTION OF THE DRAWINGS

A more complete understanding of the invention may be had by referring to the following detailed description when taken in conjunction with the drawings wherein.

DETAILED DESCRIPTION OF THE PREFERRED EMBODIMENT

Figure 1:
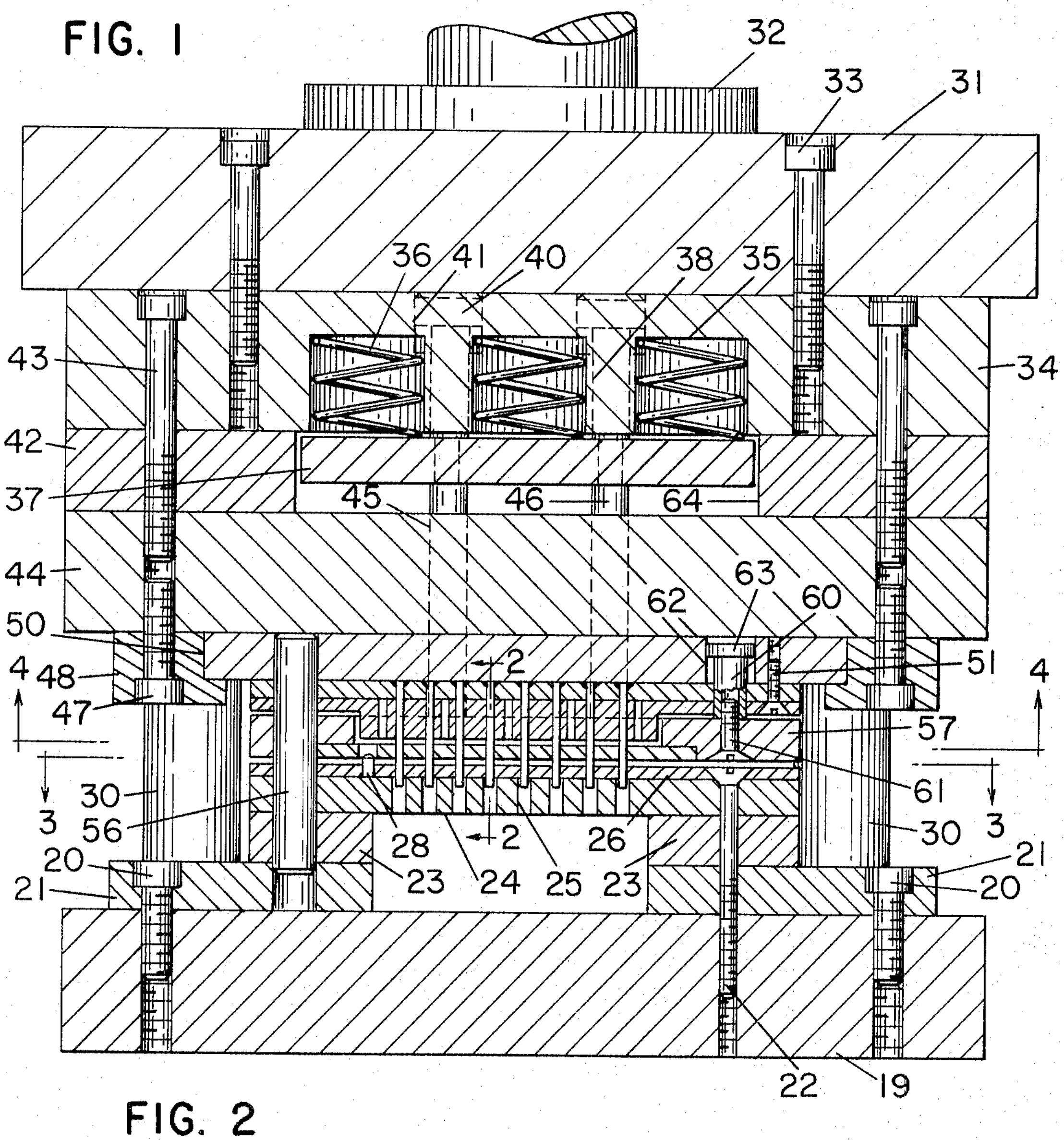
FIG. 1 is a sectional side view of the die apparatus taken on lines 1—1 of FIG. 4.
Figure 3:
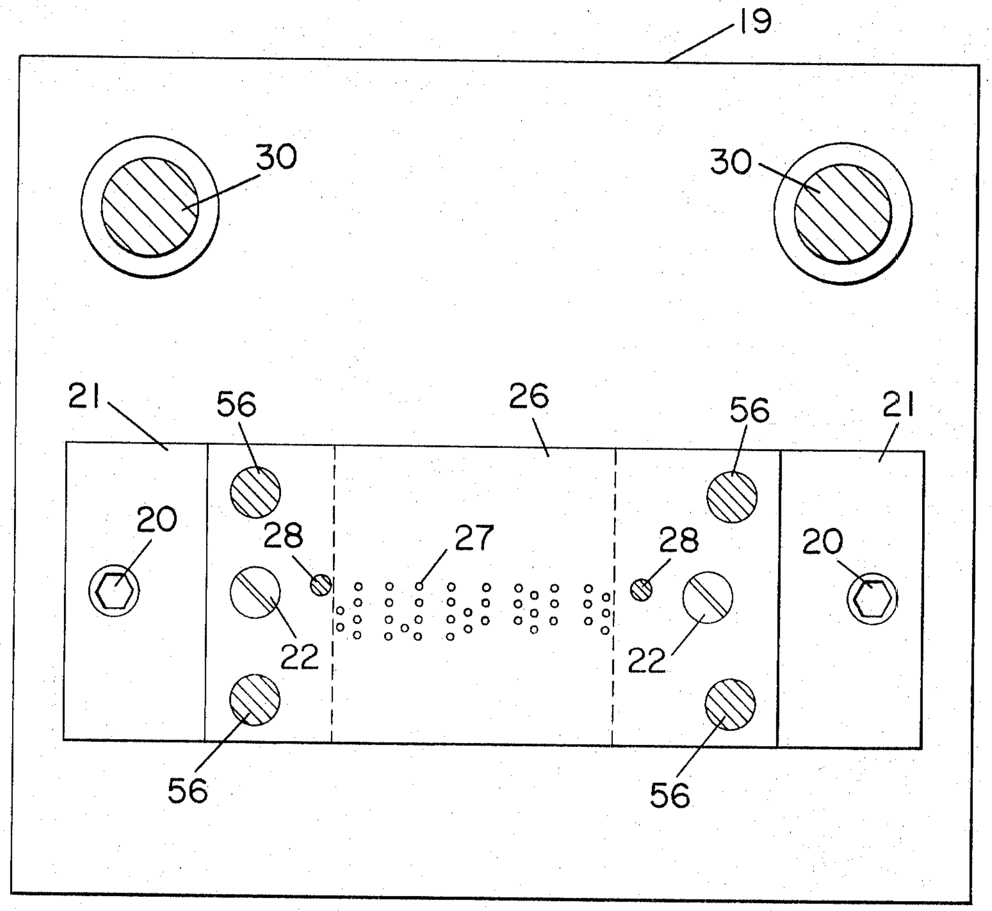
FIG. 3 is a top view of the stationary bolster and die plates taken on lines 3—3 of FIG. 1 showing the apertures located in the die plate.

Referring now to FIG. 1 of the drawings, there is shown a sectional side view of the die apparatus for punching and reaming holes in a printed circuit board which includes a stationary bolster plate 19 (FIGS. 1 and 3) to which is secured by means of bolts 20 a pair of mounting blocks 21 (FIGS. 1 and 3). Also secured to the bolster plate 19 by means of screws 22 (FIGS. 1 and 3) are a pair of sub-plates 23, a sub-plate 24 having apertures 25 located therein defining the pattern of holes that can be punched in the printed circuit board, and a die plate 26 containing apertures 27 (FIG. 3) that define the pattern of holes to be punched in the printed circuit board. The die plate 26 is positioned on the sub-plate 24 by means of a pair of locating pins 28 (FIGS. 1 and 3) secured to the sub-plate 24.

Slidably mounted on a pair of guide pins 30 (FIGS. 1 and 3) secured to the bolster plate 19 is a movable die assembly which includes a side plate 31 engaged by a ram member 32 and which is mounted by means of bolts 33 to a pressure block 34. The pressure block 34 contains six recessed areas 35, three of which are shown in FIG. 1. Mounted within each of the recessed areas 35 is a compression spring 36, one end of which engages a pressure plate 37 slidably supported by four bolts 38 which in turn are slidably mounted within the pressure block 34. The head 40 of each of the bolts 38 is mounted within a countersunk hole 41 located in the pressure block 34 and which controls the length of movement of the bolts 38 and therefore the pressure plate 37. As shown in FIG. 1, the pressure plate 37 is shown in its upper-most position which occurs during a punching operation.

Figure 4:
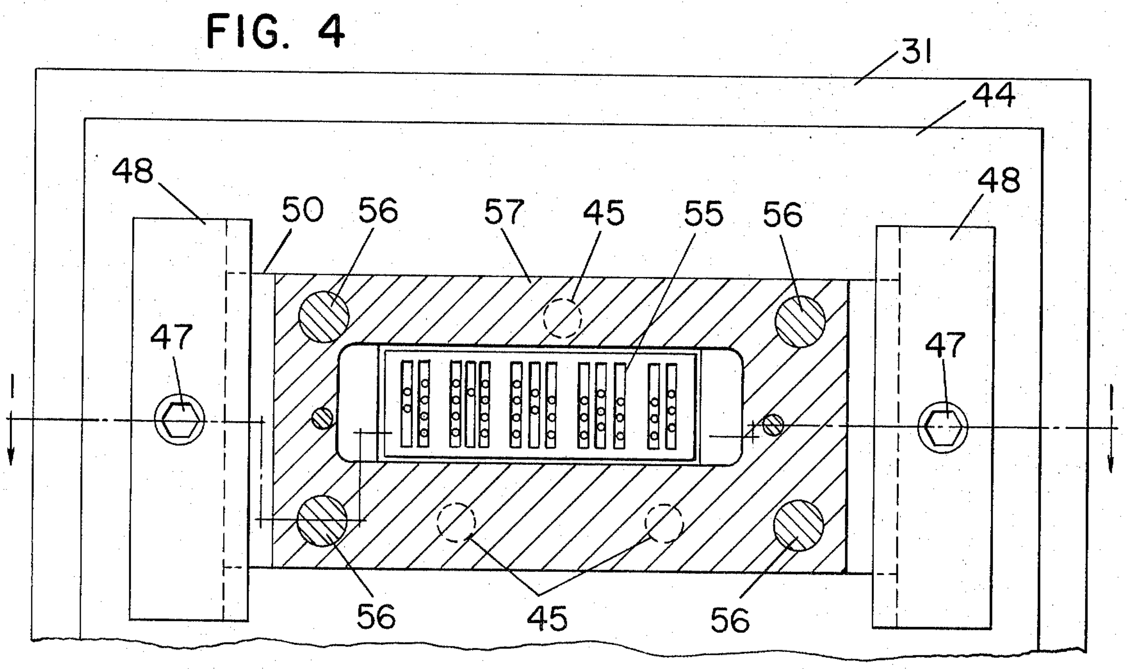
FIG. 4 is a bottom view of the movable die assembly taken on lines 4—4 of FIG. 1 showing the slots located in the punch guide.

The pressure block 34 is secured, together with an apertured side plate 42, by means of bolts 43 to a die plate 44. The die plate 44 contains three apertures 45 (FIGS. 1 and 4) within which are slidably mounted studs 46, the top of which engages the pressure plate 37.

Secured to the underside of the die plate 44 by means of bolts 47 are a pair of clamping plates 48 (FIGS. 1 and 4) which clamp a back-up plate 50 to the die plate 44. Secured to the back-up plate 50 by means of screws 51 is a punch holder 52 supporting a plurality of punch members 57 and a punch guide 54. The punch members 53 comprise the fluted end of a standard helix drill which is soldered to one edge of the punch holder 52, the punch members extending through the punch holder and through slots 55 (FIG. 4) cut in punch guide 54. Each punch member 53 includes a small portion of the drill shank which facilitates the punching of the hole in the printed circuit while the fluted portion facilitates the reaming of the hole in addition to the punching of the hole.

Figure 2:
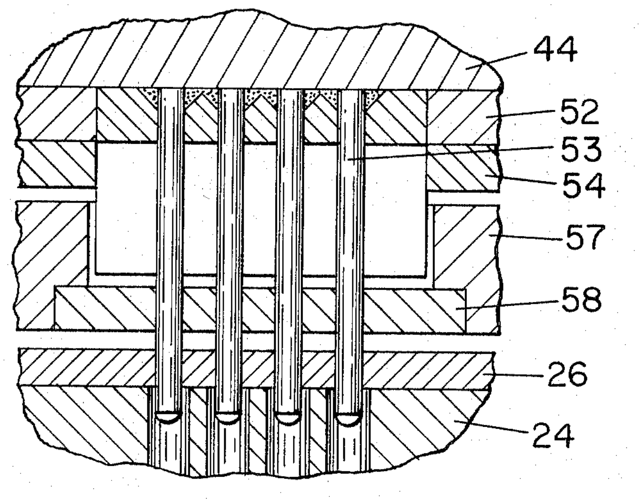
FIG. 2 is a partial sectional side view of the mounting of the punch members taken on lines 2—2 of FIG. 1.

Secured to the back-up plate 50 are four guide pins 56 which extend through the sub-plates 23 and into the mounting plates 21 when the die assembly is moved to its lowest position during a punching operation. Slidably mounted on the guide pin 56 is a two-piece stripper plate 57 (FIGS. 1 and 2) which is engaged by the lower end of the three studs 46 and which includes an insert 58 (FIG. 2) containing apertures conforming to the pattern of holes to be punched. The stripper plate 57 is secured to a stop member 60 (FIG. 1) by means of a screw 61. The stop member 60 is slidably mounted within a hole 62 located in the back-up plate 50 and is limited in its movement by a shoulder 63 which engages the punch holder 52 when moved in one direction and the die plate 44 when moved in the opposite direction. This construction controls the length of movement of the stripper plate 57 with respect to the movable die assembly.

In the operation of the die apparatus, a printed circuit board is positioned on the die plate 26 by utilizing the locating pins 28. At this time the movable die assembly has been raised to withdraw the punch members 53 from engagement with the die plate 26. When in a raised position, the pressure plate 37 will be positioned at the bottom of the aperture 64 in the side plate 42. The stripper plate 57 will be raised by the shoulder 63 of the stop member 60 engaging the top of the punch holder 52, this movement being accompanied by the upward movement of the studs 46.

After the printed circuit board has been properly positioned on the die plate 26, the ram 32 will be actuated to move the die assembly in a downward direction. This downward movement will allow the springs 36 to move the pressure plate 37 and the studs 46 in a direction to move the stripper plate 57 against the printed circuit board. Continued downward movement of the ram will compress the springs 36 thus building up pressure on the stripper plate 57 and move the punch pins 53 through the printed circuit board. The length of this downward movement of the die assembly is controlled by the engagement of the stop member 60 with the die plate 44. Movement of the punch pins 53 through the printed circuit board will allow the fluted ends of the punch pins to punch and ream holes in the circuit board. Upon withdrawing the punch pins from the circuit board, the compressed springs 36 will continue to exert a pressure on the stripper plate 57 until the punch pins have been completely withdrawn from the circuit board.

It will be seen from this construction that utilizing the fluted end of a helix drill as the punch members, holes in the printed circuit board will be punched and reamed during a single operation of the die apparatus. The punch members are supported throughout their entire length during the punch operation by the slots 55 in the punch guide 54, and the apertures in the stripper plate insert 58, the stripper plate being held against the circuit board by the compressed springs 36. After the punch members 53 have moved through the circuit board, they will be positioned within the apertures 25 of sub-plate 24 which apertures allows the chaff from the circuit board to be removed from the punching area.

Whenever a new pattern of holes is to be punched in the printed circuit board, loosening the clamping blocks 48 will allow a new punch holder, punch guide and stripper plate to be quickly inserted in the punching die assembly. Thus it will be seen that this construction allows any number of different hole patterns to be punched in circuit boards with down time of the apparatus held to a minimum.

What is claimed is:

1. An apparatus for punching holes in a circuit board comprising:

a. a support member;

b. a die plate positioned on said support member and containing apertures for receiving punch members at predetermined locations, said die plate supporting a printed circuit board thereon;

c. a stripper plate slidably mounted adjacent said printed circuit board, said stripper plate having apertures for receiving punch members at predetermined locations;

d. a movable carrier means positioned adjacent said stripper member;

e. drive means engaging said carrier means for driving said carrier means toward said stripper plate;

f. means engaging said carrier means and said stripper plate for moving said stripper plate into engagement with the circuit board upon movement of said carrier means toward said stripper plate;

g. punch holder means secured to said carrier means;

h. a punch member secured to said punch holder and extending through said stripper plate adjacent the circuit board, said punch member comprising the fluted end of a standard high helix drill;

i. and a punch guide secured to said punch holder through which said punch member extends, said punch guide and said stripper plate supporting said punch member for movement through the circuit board upon movement of said carrier means toward said stripper plate.

2. The punching apparatus of claim 1 in which said stripper plate is slidably supported on said carrier means, and said moving means includes resilient means engaging said stripper plate which urges said stripper plate against the printed circuit board upon movement of said carrier means toward said stripper plate.

3. The punching apparatus of claim 2 which includes a stop member mounted on said stripper plate, said stop member being slidably supported through a predetermined distance by said carrier means for limiting the movement of said carrier means toward said stripper plate.

4. The punching apparatus of claim 3 in which said resilient means includes a. a plurality of spring members engaging said carrier means;

b. a pressure plate engaging said spring members and slidably supported by said carrier means; and c. drive members mounted on said pressure plate and engaging said stripper plate, whereby said stripper plate will be urged into engagement with the printed circuit board by said spring members upon the movement of said carrier means towards said stripper plate.

5. An apparatus for punching holes in a printed circuit board positioned on a support member comprising:

a. a carrier assembly slidably mounted adjacent the printed circuit board;

a drive member engaging said carrier assembly for reciprocally moving said assembly toward and away from said printed circuit board;

c. a stripper plate slidably supported on said carrier assembly and positioned adjacent said circuit board, said stripper plate having apertures corresponding to the pattern of holes to be punched on the printed circuit board;

d. means slidably mounted on said carrier assembly engaging said stripper plate for moving said stripper plate against the circuit board upon movement of said carrier assembly toward the printed circuit board;

e. punch support means secured to said carrier assembly;

f. a plurality of punch members each comprising the fluted end of a standard high helix drill secured to said support means, said punch members positioned within the apertures of said stripper plate; and g. a punch guide secured to said support means containing apertures through which said punch members extend, said punch guide and said stripper plate supporting said punch members for movement through the circuit board upon movement of the carrier assembly toward said printed circuit board.

6. The punching apparatus of claim 5 in which said moving means includes a. a pressure plate slidably supported by said carrier assembly;

b. pressure actuating means engaging said pressure plate and said carrier assembly, said pressure actuating means normally urging said pressure plate toward the printed circuit board; and c. an actuating member secured to said pressure plate and engaging said stripper plate for moving said stripper plate against the printed circuit board upon movement of said carrier assembly toward the printed circuit board.

7. The punching apparatus of claim 6 in which said pressure actuating means comprises spring members engaging said pressure plate, said spring members being compressed by said carrier assembly when said stripper plate engages the printed circuit board to apply pressure to said stripper plate against the printed circuit board.

8. The punching apparatus of claim 7 which includes a stop member mounted on said stripper plate, said stop member being slidably supported through a predetermined distance by said carrier assembly for limiting the movement of said carrier assembly toward said stripper plate.

9. The punching apparatus of claim 7 in which said actuating member comprises a stud secured to said pressure plate and urged into engagement with said stripper plate by said spring members.

10. A method for punching holes in a printed circuit board comprising the steps of a. positioning a printed circuit board on a base member;

b. positioning on the printed circuit board a stripper plate having predetermined positioned apertures;

c. applying pressure to the stripper plate;

d. positioning punch members comprising the fluted end of a standard high helix drill adjacent the apertures in the stripper plate;

e. moving said punch members through the apertures in said stripper plate and the printed circuit board;

f. withdrawing the punch members from the printed circuit board; and g. holding the stripper plate against the printed circuit board while withdrawing the punch members from the printed circuit board.

11. A method for punching holes in a printed circuit board which includes a. positioning a printed circuit board on a supporting member;

b. positioning a stripper plate containing a plurality of predetermined positioned apertures on the printed circuit board;

c. applying pressure to said stripper plate;

d. positioning a movable support member adjacent the stripper plate;

e. clamping a punch holder to the movable support member, the punch holder supporting a plurality of punch members each comprising the fluted end of a standard high helix drill and positioned adjacent an aperture in the stripper plate;

f. clamping a punch guide to said support member for guiding the punch members through the apertures in the stripper plate; and g. moving said support member toward said stripper plate allowing the punch members to move through the aperture in said stripper plate and through the circuit board to punch holes in the circuit board.

12. A method for punching holes in a printed circuit board comprising the steps of a. securing a printing circuit board to a supporting member;

b. positioning on the printed circuit board a stripper plate having predetermined positioned apertures;

c. positioning punch members each comprising the fluted end of a standard high helix drill adjacent the apertures in the stripper plate;

d. moving said punch members through the apertures in said stripper plate and the printed circuit board;

e. applying increasing pressure to the stripper plate as the punch members move through the stripper plate and the printed circuit board;

f. withdrawing the punch members from the printed circuit board; and g. holding the stripper plate against the printed circuit board while withdrawing the punch members from the printed circuit board.

* * * * *